United States Patent [19]

Yeon et al.

[11] Patent Number: 5,398,213
[45] Date of Patent: Mar. 14, 1995

[54] ACCESS TIME SPEED-UP CIRCUIT FOR A SEMICONDUCTOR MEMORY DEVICE

[75] Inventors: Eung-Moon Yeon, Seoul; Young-Ho Lim, Daegu, both of Rep. of Korea

[73] Assignee: Samsung Electronics Co., Ltd., Suwon-City, Rep. of Korea

[21] Appl. No.: 133,471

[22] Filed: Oct. 8, 1993

[30] Foreign Application Priority Data

Oct. 8, 1992 [KR] Rep. of Korea .................. 18440

[51] Int. Cl.$^6$ ............................................. G11C 8/00
[52] U.S. Cl. .............................. 365/238.5; 365/189.05
[58] Field of Search .................. 365/238.5, 189.05

[56] References Cited

U.S. PATENT DOCUMENTS 5,305,284 4/1994 Iwase .................. 365/238.5

Primary Examiner—Do Hyum Yoo
Attorney, Agent, or Firm—Charles R. Donohoe; Robert A. Westerlund, Jr.; Stephen R. Whitt

[57] ABSTRACT

A semiconductor memory device includes two latch circuits, each for holding data corresponding to a single normal address. When sequentially used, one after the other, one latch circuit can be storing new data while the other latch circuit outputs its data to the page decoder for subsequent output. Thus, data access delay times for page mode operation are further reduced because the delay which typically results from addressing a normal address is eliminated.

2 Claims, 5 Drawing Sheets

ACCESS TIME SPEED-UP CIRCUIT FOR A SEMICONDUCTOR MEMORY DEVICE

BACKGROUND OF THE INVENTION

1. Field of the Invention

The present invention relates to a semiconductor memory device, and more particularly to an access time speed-up circuit for a semiconductor memory device.

2. Background of the Related Art

To shorten data access times, semiconductor memory devices have employed a page mode operation mode in which, when a predetermined address appears, all corresponding data are sensed and then held. When the next address appears, the data preliminary held are output. Thus in the page mode, the time required for address decoding and data sensing can be substantially reduced.

FIG. 1 shows the functional structure of a conventional semiconductor memory device that operates in the page mode. The conventional memory device of FIG. 1 has a normal address buffer 10 for receiving normal address signals $AN_1 \sim AN_Y$, and a page decoder 17 for converting $2^n \times m$ data bits read from a memory cell array 12 when using the normal address signals $AN_1 \sim AN_Y$ to address m-bits of data during a decoding operation. The decoding operation addresses m data bits for each different $2^n$ page address and is controlled by decoding signals generated from a page address buffer 16, which receives page address input signals AP1–APn.

FIG. 2 is a timing diagram showing data access timing according to the conventional semiconductor memory device of FIG. 1. $t_{BA}$ Denotes the time for buffering the normal address input signals $AN_1-AN_Y$ through the normal address buffer 10, for decoding the buffered normal address input signals through the X/Y decoder 11 and for sensing data from the memory cell array 12. After time $t_{BA}$ elapses, the data output operation with the page address input signals is accomplished in a time $t_{PBA}$, such that each page of m-bit data sensed by the sense amplifier circuit 14 is converted to resultant output data. $t_{PA}$ denotes the time, referred to as one cycle time of page mode access operation, for generating all the data for each page of m-bit data.

The data access time, without use of page mode operation, for one page of data can be defined by an equation such as $2^n \times t_{BA}$ (n denotes the number of page address bits). With use of page mode operation, this data access time becomes $t_{BA}+(2^n-1)$. Assuming that time $t_{BA}$ is 150 nano-seconds for a conventional semiconductor memory device, time $t_{PBA}$ becomes 70 nano-seconds. Thus, when the value of n is 3, data access time (without page mode operation) is 1200 nano-seconds. With page mode operation, data access time is 640 nano-seconds. Clearly, page mode provides faster access times.

However, as shown in FIG. 2, the conventional page mode requires a time $t_{BA}$ for accessing the data of $2^n \times m$ bits whenever every page mode cycle is initiated.

SUMMARY OF THE INVENTION

Accordingly, it is an object of the present invention to provide a semiconductor memory device capable of reducing the data access time in a page mode operation.

It is another object of the present invention to provide a semiconductor memory device capable of eliminating the delay of the data access time due to the use of the normal address in every page mode cycle.

To achieve the above objects, the present invention includes two latch circuits, each for holding data corresponding to a single normal address. When sequentially used, one after the other, one latch circuit can be storing new data while the other latch circuit outputs its data to the page decoder for subsequent output. Thus, data access delay times for page mode operation are further reduced because the delay which typically results from addressing a normal address is eliminated.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PREFERRED EMBODIMENT

Figure 1:
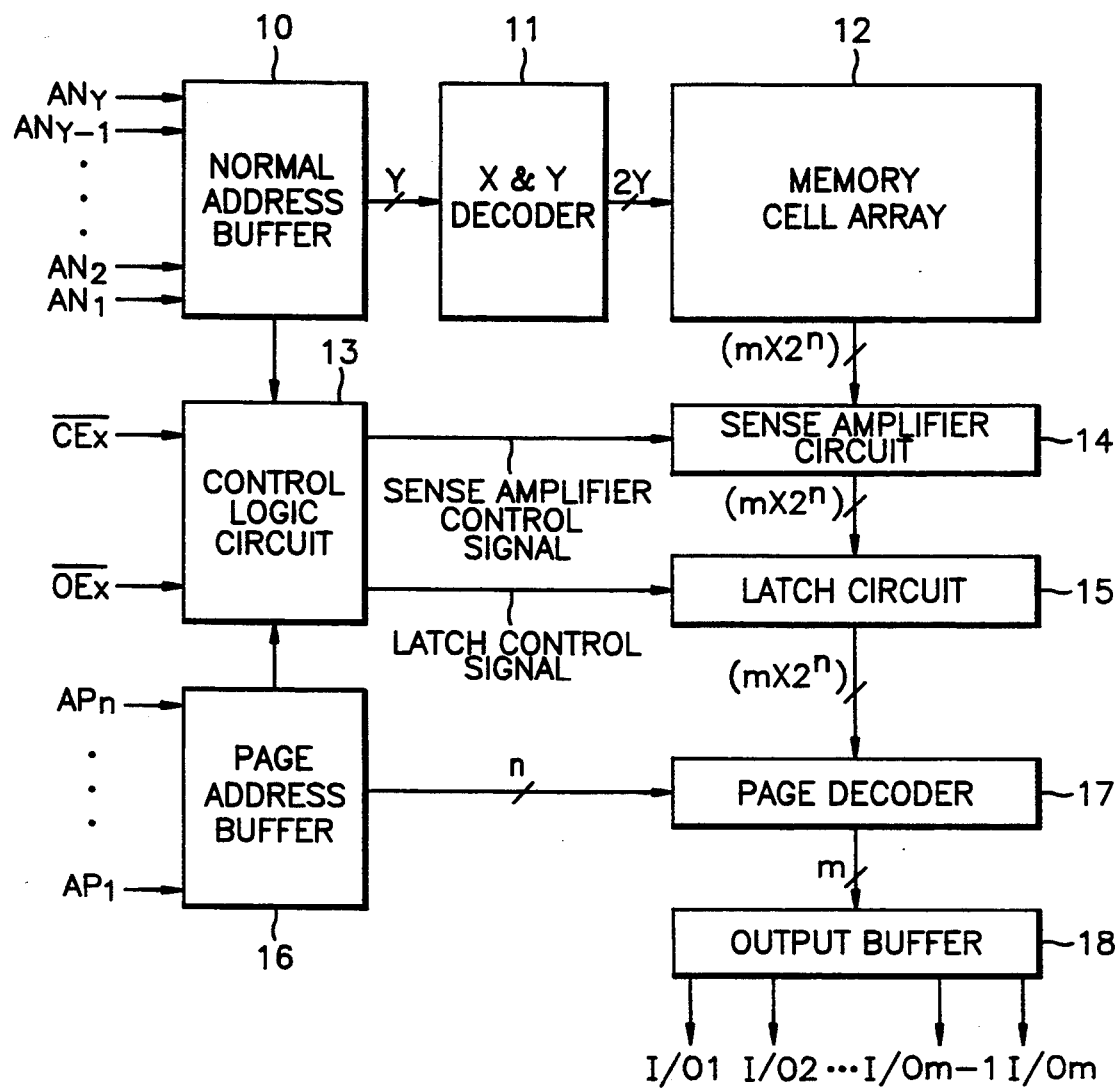
FIG. 1 is a functional block diagram of a semiconductor memory device using conventional page mode operation.
Figure 2:
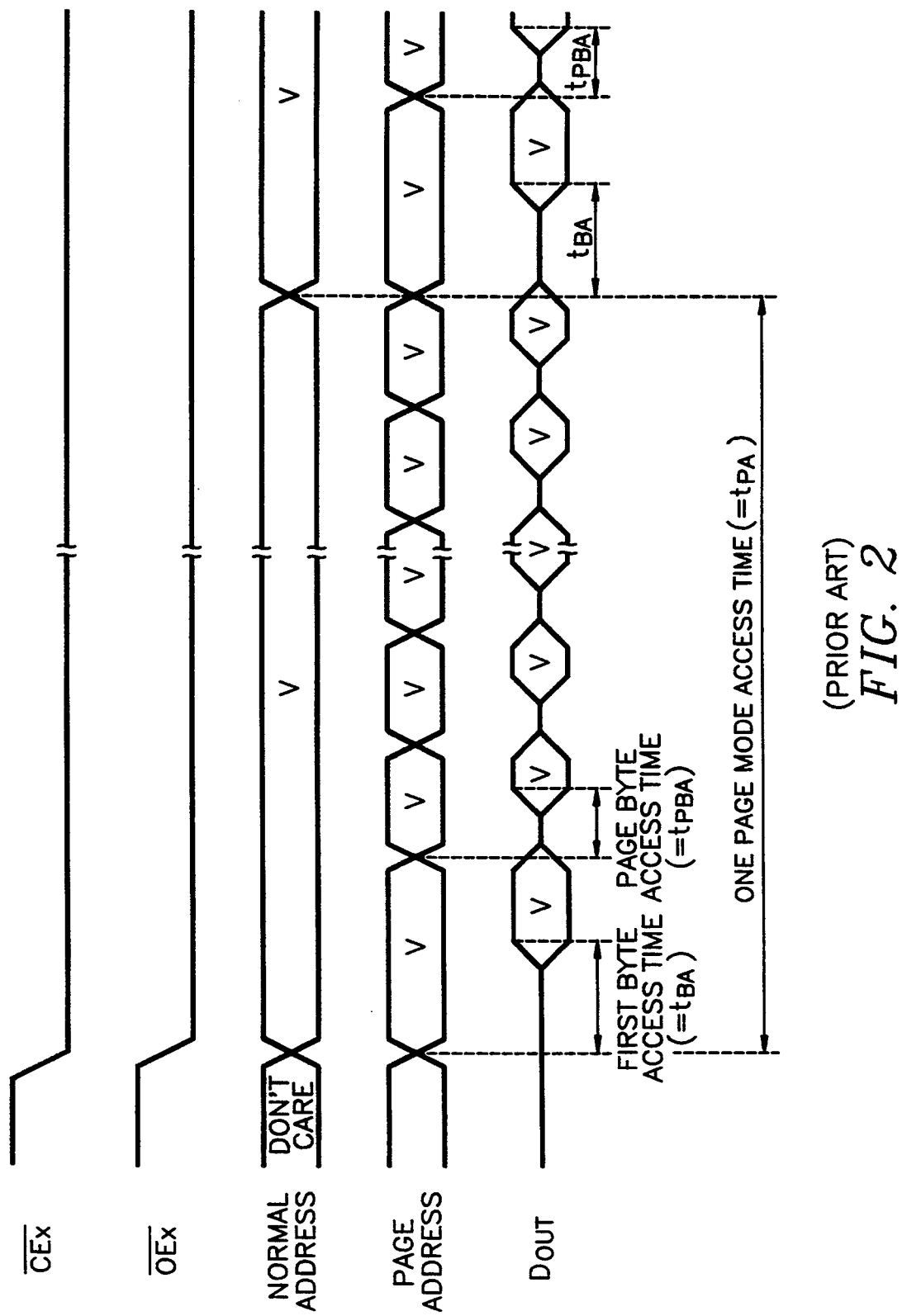
FIG. 2 is a timing diagram illustrating conventional data access operations of the semiconductor memory device shown in FIG. 1.
Figure 3:
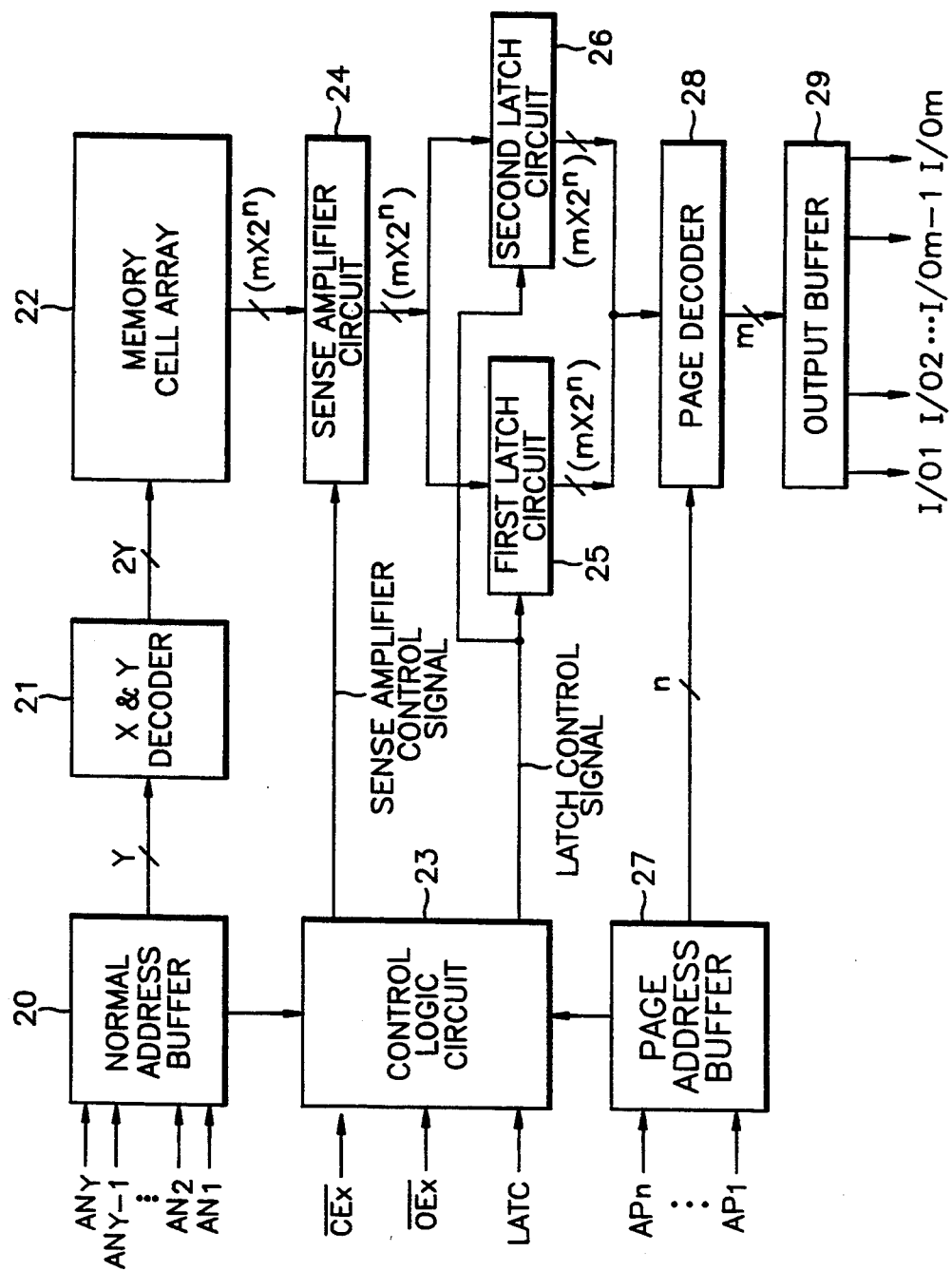
FIG. 3 is a functional block diagram of a semiconductor memory device with page mode operation according to the present invention.

FIG. 3 illustrates a block diagram of the present invention which includes a normal address buffer 20 receiving normal address input signals $AN_1 \sim AN_Y$, a X/Y decoder 21, a memory cell array 22, a sense amplifier circuit 24, a page address buffer 27 receiving page address input signals $AP_1 \sim AP_n$, a page decoder 28 and an output buffer 29. These circuit elements are the same as those of FIG. 1.

The number of data bits in one page is m, and the number of data bits which are sensed from the memory cell array 22 by the normal address input signals is $m \times 2^n$ (hereinafter the term $2^n$ is referred to as "k").

Control logic circuit 23 receives a chip enable signal /CEx, an output enable signal /OEx and a next address incoming signal LATC and generates sense amplifier control signal and latch control signal. First and second latch circuits 25 and 26, respectively, have k latches, and temporarily store k bits of data and transfer them to the page decoder 28 in dependence on the latch control signal. The output lines from the first and second latch circuits are alternatively selected by the latch control signal to thereby provide the output from one of the latch circuits to an input terminal of the page decoder 28. The page decoder 28 sequentially converts the k-bits of data to m-bits of data, $2^n$ different times, using page decoding signals generated from page address buffer 27.

Figure 4:
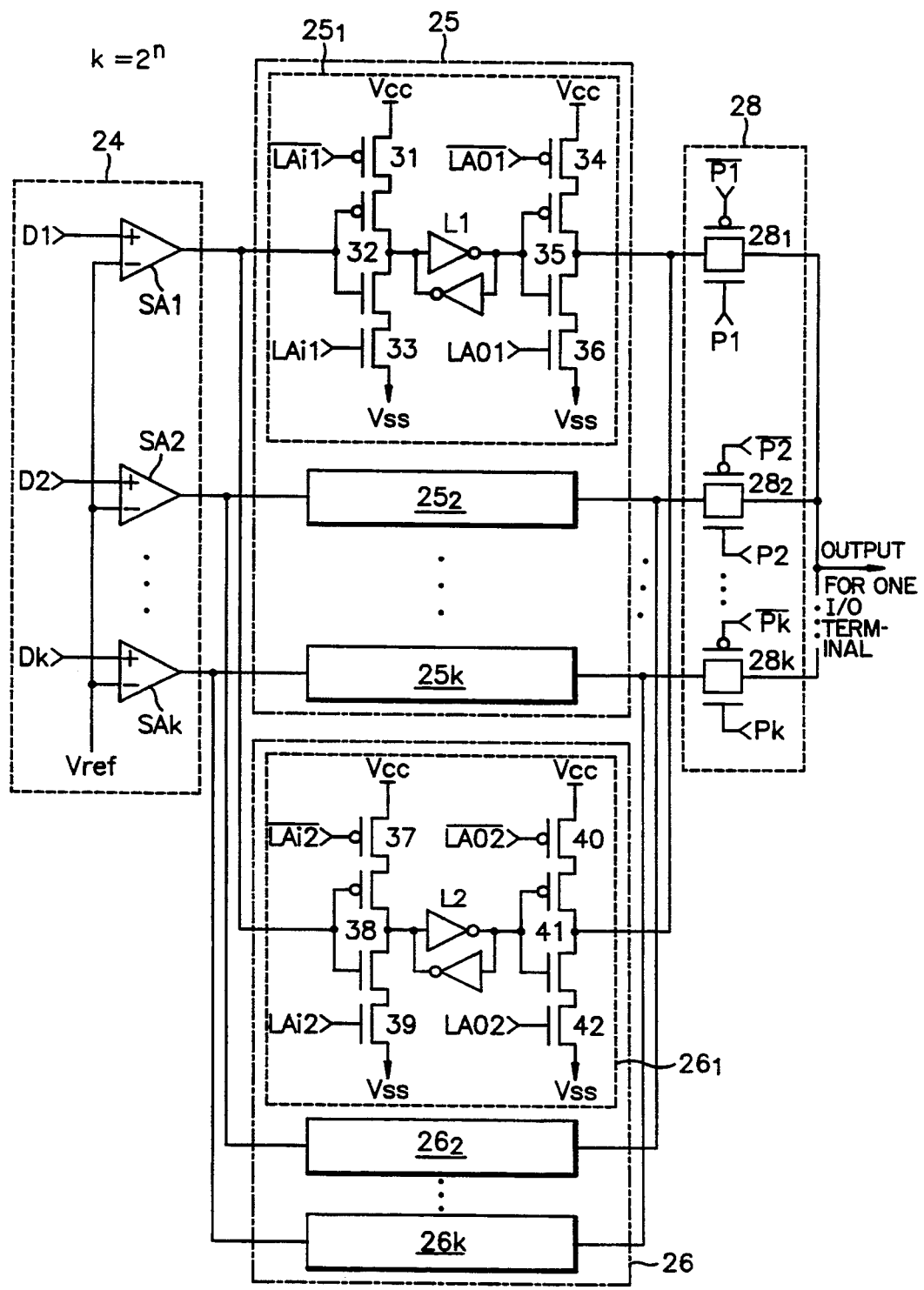
FIG. 4 is a circuit diagram showing detailed features of the sense amplifier circuit, the latch circuit and page decoder according to the present invention.

FIG. 4 shows more detailed circuit diagrams of the first and second latch circuits 25 and 26 with the sense amplifier circuit 24 and the page decoder 28. The sense amplifier circuit 24 consists of sense amplifiers SA1–SAk for the k data bits from the memory cell array 22. A reference voltage Vref is applied to all negative input terminals of the sense amplifiers SA1–SAk. Each set of output signals from the sense amplifiers is commonly applied to one latch of the first latch circuit 25 and one latch of the second latch circuit 26 (for example, an output signal of a sense amplifier SA1 is commonly applied to a latch $25_1$, of the first latch circuit 25 and a latch $26_1$ of the second latch circuit 26). The first latch circuit 25 consists of latches $25_1$-$25_k$ and the second latch circuit 26 consists of latches $26_1$, -$26_k$. Circuit architectures of all the latches are identical.

As an example, the latch $25_1$ in the first latch circuit 25 includes an inverter 32 receiving an output signal of the sense amplifier SA1, a p-channel MOS transistor 31 has a channel connected between the power supply voltage Vcc and the inverter 32 and a gate coupled to an inverted first latch input control signal/$LA_{i1}$. An n-channel MOS transistor 33 has a channel is connected between the inverter 32 and a ground voltage Vss and a gate coupled to a first latch input control signal $LA_{i1}$. A latch loop L1 is connected to an output terminal of the inverter 32 and an inverter 35 is connected to an output terminal of the latch loop L1. A p-channel MOS transistor 34 has a channel connected between a power supply voltage Vcc and the inverter 35 and a gate coupled to an inverted first latch output control signal/$LA_{o1}$. An n-channel MOS transistor 36 has a channel connected between the inverter 35 and the ground voltage Vss and a gate coupled to a first latch output control signal $LA\phi 1$. The latch $26_1$ in the second latch circuit 26 includes these same circuit elements, an inverter 38, a p-channel MOS transistor 37, an n-channel MOS transistor 39, a latch loop L2, an inverter 41, a p-channel MOS transistor 40, and an n-channel MOS transistor 42. Control signals and connections are made in the same manner described with reference to first latch circuit 25, with the control signals directed toward the record latch circuit 26.

Output signals from one latch (for example, $25_1$) of the first latch circuit 25 and one latch (for example, $26_1$) of the second latch circuit 26 share one output line, which shared line is connected to one transfer gate (for example, $28_1$) of the page decoder 28. Thus, each of the k data bits of the sense amplifiers SA1-SAk has two alternative paths; one is through one latch of the first latch circuit 25, the other through one latch of the second latch circuit 26. The page decoder 28 has transfer gates $28_1$-$28_k$ which are gated by the page decoding signals generated from the page address buffer 27, respectively.

Figure 5:
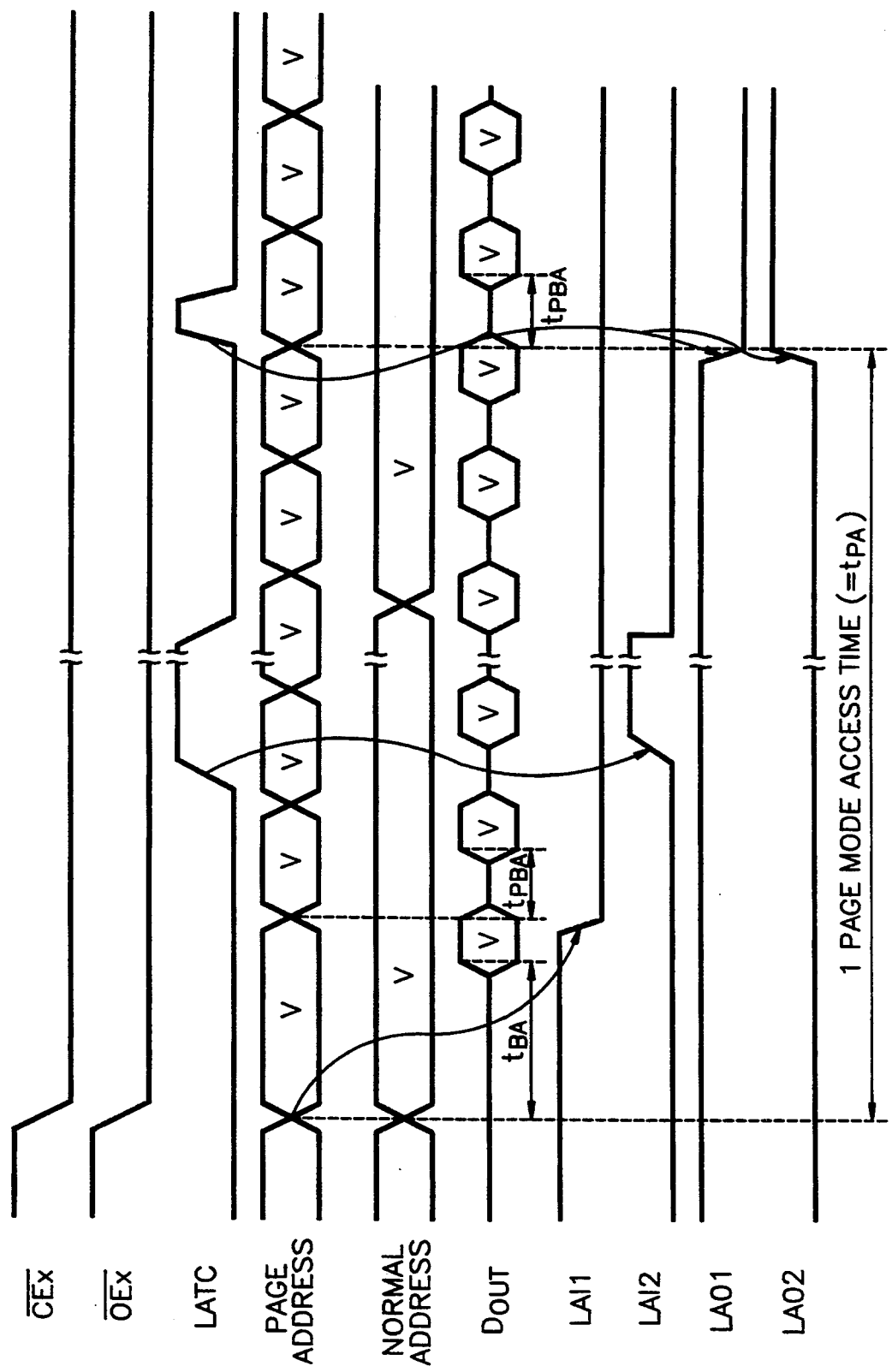
FIG. 5 is a timing diagram illustrating data access operations according to the present invention.

Operation of the present invention will now be described with reference to FIG.5. When a first page mode cycle is initiated, data corresponding to a first normal address is stored in the latch loops (elements labelled to "L1" in the first latch circuit 25) of the first latch circuit 25 by the first latch input control signal $LA_{i1}$, which is at logic high state. The data is then transferred to the page decoder 28 by the first latch output control signal $LA_{o1}$. In the page decoder 28, the data supplied from the first latch circuit 25 passes through the transfer gates $28_1$-$28_k$ by the control operation with the page decoding signals P1-$P_k$ resulting from first page address and is thereby applied to the output buffer 29. While the first latch circuit 25 is activated, the second latch 26 is not activated because the second latch input and output control signals $LA_{i2}$ and $LA_{o2}$ are both at logic low states.

When after time $t_{PBA}$ elapses for accessing the data of m-bits of the first page address, the next address incoming signal LATC is activated, responding to the receipt of the next normal address with a short pulse of logic high state. The second latch input control signal $LA_{i2}$ initiates the data input operation of the second latch circuit 26. Thus, data corresponding to the second normal address are applied to the latch loops (elements the same as that labelled to L2 in the second latch 26) in the second latch circuit 26 and stored therein. At this time, since the second latch output control signal $LA_{o2}$ is still at the logic low state, the output operation of the second latch circuit 26 is precluded and does not influence the output operation of the first latch circuit 25 even when the data path from the sense amplifier circuit 24 to the page decoder 28 is formed through the first latch circuit 25. During one page mode cycle, the second latch circuit 26 holds the data corresponding to a normal address for the next page mode cycle while the first latch circuit 25 accesses the data corresponding to the normal address for the present page mode cycle.

At the beginning of the next page mode cycle, after m data bits have been selected by the page decoder 28 and then generated from the output buffer 29, the next address incoming signal LATC is again activated and the second latch output control signal $LA_{o2}$ goes to a logic high state. Thus, the second latch circuit 26 transfers its data (corresponding to the second normal address), which have been stored therein, to the page decoder 28. At this time, the first latch circuit 25 is disabled because the first latch input and output signals $LA_{i1}$, and $L_{o1}$ are at the logic low state.

As illustrated above, the data transfer path from the sense amplifier circuit 24 to the page decoder 28 in every page mode cycle is alternatively selected through one of the first and second latch circuits 25 and 26. One latch circuit transfers data corresponding to the present normal address to the page decoder 28, while the other stores different data corresponding to the next normal address. Therefore, the time $t_{BA}$ for accessing data, corresponding to the normal address, is only required in the first page mode cycle and does not contribute to the data access time for most of the page mode operation.

The first page mode cycle has an access time of $t_{BA}+(2^n-1)t_{PBA}$, and each of other page mode cycles but the first cycle has an access time of $2^n \times t_{PBA}$. Thus, assuming that time $t_{BA}$ is 150 nano-seconds, $t_{PBA}$ is 70 nano-seconds time and n is 3, the data access time of each cycle (with the exception of the first cycle which has an access time of 640 nanoseconds) is 560 nanoseconds. As a result, the data access time of each page mode cycle, except for the first page mode cycle, is shortened considerably.

While there is shown and described the preferred embodiment of the invention, it will be understood by those skilled in the art that foregoing and other changes in form and details may be made without departing from the spirit and scope of the present invention.

What is claimed is:

1. A semiconductor memory device which operates in a page mode comprising:
   a memory cell array including a plurality of memory cells, each cell having a normal address, said memory cell array further being divided into a plurality of pages, each page being defined by a page address that represents a plurality of said memory cells;
   means for sensing data associated with first and second normal addresses; and
   first and second latch circuit arrays for outputting data corresponding to said first normal address when said means for sensing is sensing data corresponding to said second normal address, said first and second latch circuit arrays alternatively activated by a latch control signal generated in response to a change in said normal address.

2. A semiconductor memory device according to claim 1, wherein said device further comprises a page decoder for converting said data generated from said first and second latch circuit arrays into a plurality of data packets, each data packet corresponding to one of said plurality of page addresses, each said data packet consisting of a predetermined number of data bits by said page address.

* * * * *